United States Patent
Wern et al.

(10) Patent No.: US 7,193,833 B2
(45) Date of Patent: Mar. 20, 2007

(54) ELECTRIC SWITCH

(75) Inventors: Lars Ake Wern, Stockholm (SE); Jan Johansson, Bromma (SE)

(73) Assignee: Aktiebolagat Electrolux, Stockholm (SE)

( * ) Notice: Subject to any disclaimer, the term of this patent is extended or adjusted under 35 U.S.C. 154(b) by 330 days.

(21) Appl. No.: 10/474,662

(22) PCT Filed: Apr. 26, 2002

(86) PCT No.: PCT/SE02/00825

§ 371 (c)(1),
(2), (4) Date: Jun. 1, 2004

(87) PCT Pub. No.: WO02/089328

PCT Pub. Date: Nov. 7, 2002

(65) Prior Publication Data

US 2004/0196606 A1    Oct. 7, 2004

(30) Foreign Application Priority Data

Apr. 27, 2001    (SE) .................................... 0101504

(51) Int. Cl.
*H03K 17/96* (2006.01)

(52) U.S. Cl. ...................... 361/181; 361/179; 327/517

(58) Field of Classification Search ............... 361/181, 361/179; 327/517
See application file for complete search history.

(56) References Cited

U.S. PATENT DOCUMENTS

| | | | | |
|---|---|---|---|---|
| 2,863,472 A | * | 12/1958 | Coles et al. | 137/392 |
| 3,811,054 A | | 5/1974 | Wern et al. | |
| 3,889,132 A | * | 6/1975 | Vreeland | 307/141 |
| 4,494,012 A | * | 1/1985 | Coker | 307/132 E |
| RE33,285 E | * | 7/1990 | Kunen | 307/116 |
| 5,841,617 A | * | 11/1998 | Watkins et al. | 361/106 |
| 6,075,356 A | * | 6/2000 | Kovacs | 323/327 |

FOREIGN PATENT DOCUMENTS

SE    355719    4/1973

* cited by examiner

*Primary Examiner*—Stephen W. Jackson
*Assistant Examiner*—Scott Bauer
(74) *Attorney, Agent, or Firm*—Pearne & Gordon LLP

(57) ABSTRACT

An electric switch (1) comprising a capacity sensor circuit (2) provided with a signal input (3) arranged to be connected to an actuating line, and which is provided with a relay device (4) arranged to feed a current to a load line (7) from a power source (6) in response to a capacitive influence along said actuating line. According to the invention the signal input (3) of the sensor circuit (2) is arranged to be connected to the load line (7) in such a manner that the load line will constitute said actuating line.

5 Claims, 1 Drawing Sheet

ELECTRIC SWITCH

This application claims the benefit of International Application Number PCT/SE02/00825, which was published in English on Nov. 7, 2002.

FIELD OF INVENTION

The invention relates to an electric switch comprising a capacity sensor circuit provided with a signal input arranged to be connected to an actuating line, and which is provided with a relay device arranged to feed a current to a load line from a power source in response to a capacitive influence along said actuating line.

PRIOR ART

An electric switch of this kind is disclosed in the Swedish Patent Specification 355 719. A capacitive sensor circuit is disposed for an actuating line in a single pole low current embodiment, the actuating line being enabled by a touch control of a load. The actuating line and its installation e.g. for illumination, has been simplified but not eliminated after a 100 years of development.

SUMMARY OF THE INVENTION

The electric switch according to the invention, like the previously known device, will enable a touch control of a load line by a capacitive influence along the actuating line, but differs from the known device in that the load line constitutes the actuating line, whereby the latter is eliminated as a second component as is the associated handling thereof. Several embodiments will be disclosed below, all being based on the feature of connecting the signal input of the central circuit to the load line in such a manner that the load line will constitute the actuating line.

BRIEF DESCRIPTION OF THE DRAWINGS

The electric switch according to the invention, the features of which are stated in the appended claims, will now be described with reference to the drawings wherein FIG. 1 is a block diagram of a preferred embodiment, whereas

DESCRIPTION OF A PREFERRED EMBODIMENT

Figure 1:
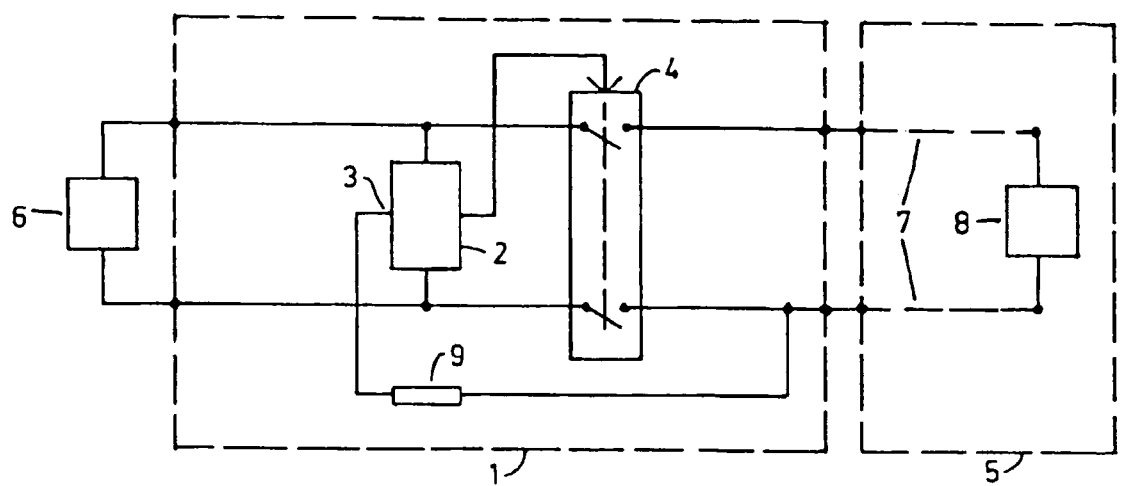

FIG. 1 shows an electric switch in a preferred embodiment of the invention, comprising a capacitive sensor circuit 2 which is provided with a signal input 3 arranged to be connected to an actuating line and which is provided with a delay device 4 arranged to feed a current to an external load circuit 5 from an external power source 6 in response to a capacitive influence along the actuating line, the signal input 3 of the sensor circuit 2 being arranged to be connected to a load circuit 5 in such a way that the load line in the latter, with possible branches and junctions, will constitute the actuating line itself.

In this embodiment, the relay device 4 is a device with two poles and arranged for connection of the power source 6 to the load circuit 5, the latter being disconnected in a normal state of the sensor circuit 2. In the example, the sensor circuit 2 also has a built-in time measurement device arranged to be activated upon connection of the load circuit 5 in order to disconnect the latter again and reset the sensor circuit 2 to its normal state after a predetermined time period.

An alternative to this automatic time control would be an external disconnection of the power source 6. The latter may be designed for DC current or AC current and is arranged to feed current to the sensor circuit 2 which in the illustrated embodiment feeds internally generated pulses to the signal input 3 for a voltage division therein in response to the momentary capacitance between the power source 6 and the load circuit 5. In the latter, the load line 7 is connected to an electric load 8. Together, these two components will have a substantially lower capacitance to ground than the power source 6. In the example, the latter is simply a power network. The sensor input 3 and the signal ground of the sensor circuit 2 are connected via a contact pair of the two pole relay device 4 such that a short circuit is effected between them when the load circuit is in a connected state. The signal input 3 is provided with a protective resistor 9 having a resistance of 3 kiloohm.

If embodiments with protective ground are selected for the switch 1 and the load circuit 5, the latter can still be controlled by touching the load line 7 but not by touching ground protective metal surfaces of the load 8. In non-grounded embodiments the proximity of a human body along the load line 7 and adjacent to the load 8 can smoothly control the latter at a distance which can be limited to approximately 0.1 m in order to achieve a reliable control function. This distance can be further limited by grounded objects located adjacent thereto.

Figure 2:
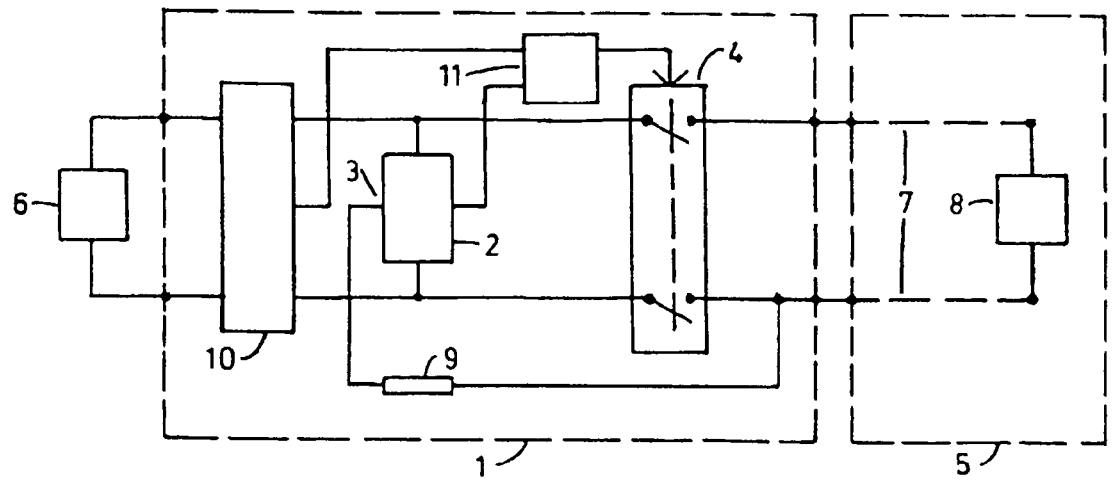
FIGS. 2 and 3 show alternative embodiments.

FIG. 2 shows the same block diagram and the same reference numerals as in FIG. 1, however with the addition of a ground fault detection sensor circuit 10 arranged to control, together with a sensor circuit 2, the relay device 4 via an AND-circuit 11. In the example, the power source 6 supplies an alternating current with the voltage 230V and the frequency 50 Hz, the protective resistor 9 of the sensor circuit 2, at the signal input 3, having a resistance of 10 megaohm, so that the secure operation of the ground fault detector will not be endangered. The signal input 3 of the sensor circuit 3 will use the power source 6 as a signal generator, as described in the Swedish Patent Specification 355 719.

Figure 3:
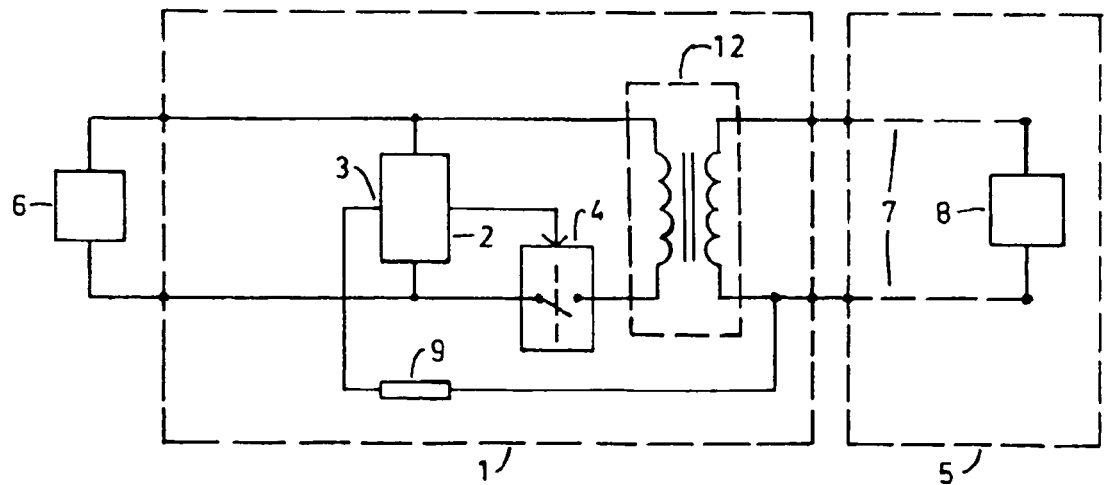

FIG. 3 shows a third embodiment of the invention with the same block diagram and reference numerals as in FIG. 2, however without any ground fault detecting sensor circuit 10. A full wave transformer 12 is arranged for feeding current from the relay device 4 to the load circuit 5. The relay device 4 is single polar and not dual polar in the example. The protective resistor 9 and the sensor circuit 2 will operate in the same way as described in relation to FIG. 2. However, in contrast to the embodiments described above, the load circuit 5 can be controlled by a capacitive influence even when the load circuit is in its connected state.

The embodiments of the invention can be modified in many ways for different applications, i.e. illumination, heating and/or alarm with a proximity control and automatic disconnection after a predetermined time period according to FIGS. 1 and 2. The embodiment of FIG. 3 may be used for protection of objects illuminated of low voltage lamps being switched off when the protective objects are being touched.

The invention claimed is:

1. An electric switch (1) comprising a capacity sensor circuit (2) provided with a signal input (3) arranged to be connected to an actuating line, and which is provided with a relay device (4) arranged to feed a current to a load line (7)

from a power source (6) in response to a capacitive influence along said actuating line, wherein the signal input (3) is arranged to be connected to the load line (7) in such a manner that the load line will constitute said actuating line, characterized in that said power source is arranged to feed current to the capacity sensor circuit (2) which feeds internally generated pulses to the signal input (3) for a voltage division therein in response to momentary capacitance between the power source (6) and a load (5) to which the load line (7) is connected.

2. An electric switch as defined in claim 1, characterised in that the signal input (3) and a signal ground terminal of the sensor circuit (2) are connected via a contact pair of a two polar embodiment of said relay device (4), the relay device (4) being arranged for disconnection of the load line (5) in a normal state of the sensor circuit (2).

3. An electric switch as defined in claim 1, characterised in that the sensor circuit (2) has a built-in time measurement device arranged to be activated upon connection of the load line in order to disconnect the latter again and resetting the sensor circuit (2) to its normal state after a predetermined time period.

4. An electric switch as defined in claim 1, characterised in that the sensor circuit (2) is arranged to control said relay device (4) in co-operation with a ground fault detector circuit (10), said power source (6) being a power network and the sensor circuit (2) being arranged to use the latter as a signal generator for its capacitive control operation.

5. An electric switch as defined in claim 1, characterized in that a full wave transformer (12) is arranged for said current feeding to said load line (7) having a primary side connected to the signal ground of the sensor circuit 2 and a secondary side connected to said signal input (3).

* * * * *